(12) United States Patent
Fujimoto et al.

(10) Patent No.: US 11,621,535 B2
(45) Date of Patent: Apr. 4, 2023

(54) FIBER LASER APPARATUS

(71) Applicant: KIMMON KOHA CO., LTD., Tokyo (JP)

(72) Inventors: Yasushi Fujimoto, Chiba (JP); Paul Binun, Tokyo (JP); Shinji Motokoshi, Osaka (JP); Masamori Nakahara, Tokyo (JP); Takeshi Hamada, Tokyo (JP)

(73) Assignee: KIMMON KOHA CO., LTD., Tokyo (JP)

( * ) Notice: Subject to any disclaimer, the term of this patent is extended or adjusted under 35 U.S.C. 154(b) by 0 days.

(21) Appl. No.: 17/644,208

(22) Filed: Dec. 14, 2021

(65) Prior Publication Data
US 2022/0109280 A1    Apr. 7, 2022

Related U.S. Application Data

(63) Continuation of application No. PCT/JP2020/027994, filed on Jul. 20, 2020.

(30) Foreign Application Priority Data

Jul. 26, 2019  (JP) .............................. JP2019-138108

(51) Int. Cl.
*H01S 3/067*   (2006.01)
*G02B 6/42*    (2006.01)
(Continued)

(52) U.S. Cl.
CPC ........ *H01S 3/06704* (2013.01); *G02B 6/4267* (2013.01); *G02B 6/4272* (2013.01);
(Continued)

(58) Field of Classification Search
CPC ............... H01S 3/06704; H01S 3/0405; G02B 6/4267; G02B 6/4266–4273; G02B 6/3636–3644; G02B 6/4243
See application file for complete search history.

(56) References Cited

U.S. PATENT DOCUMENTS

| 6,263,143 B1 | 7/2001 | Potteiger et al. | |
| 8,483,247 B2 * | 7/2013 | Rossi ....................... | H01S 5/141 |
| | | | 372/99 |

(Continued)

FOREIGN PATENT DOCUMENTS

| JP | H10-135548 A | 5/1998 |
| JP | 2002-022972 A | 1/2002 |

(Continued)

OTHER PUBLICATIONS

Zhu et al. ("High-power ZBLAN glass fiber lasers: review and prospect", Advances in OptoElectronics, pp. 1-23, Jan. 2010) (Year: 2010).*

(Continued)

*Primary Examiner* — Tod T Van Roy
(74) *Attorney, Agent, or Firm* — Osha Bergman Watanabe & Burton LLP (57) ABSTRACT

A fiber laser apparatus includes: a short-length type fiber to which an active element is added and that has a length of 300 mm or less: a ferrule attached to an end of the fiber; and a housing that accommodates the fiber and supports the fiber with the ferrule. Each of the housing and the ferrule is composed of a material having a first thermal expansion coefficient that is equal to or have a predetermined difference from a second thermal expansion coefficient of a raw material of the fiber. The predetermined difference between the first and second thermal expansion coefficients is within $-8.6 \times 10^{-6}$ to $11.4 \times 10^{-6}$/K.

13 Claims, 7 Drawing Sheets

(51) Int. Cl.
  *H01S 3/04* (2006.01)
  *H01S 3/16* (2006.01)
  *H01S 3/081* (2006.01)
  *H01S 3/0941* (2006.01)

(52) U.S. Cl.
  CPC ........ *H01S 3/0405* (2013.01); *H01S 3/06716* (2013.01); *H01S 3/1613* (2013.01); *H01S 3/0813* (2013.01); *H01S 3/09415* (2013.01)

(56) References Cited

U.S. PATENT DOCUMENTS

| | | | | |
|---|---|---|---|---|
| 2007/0206909 | A1* | 9/2007 | Wetter | G02B 6/0218 385/92 |
| 2013/0011102 | A1* | 1/2013 | Rinzler | G02B 6/3813 385/94 |
| 2018/0246280 | A1 | 8/2018 | Liermann et al. | |

FOREIGN PATENT DOCUMENTS

| | | | |
|---|---|---|---|
| JP | 2002-531937 A | 9/2002 | |
| JP | 2004-214325 A | 7/2004 | |
| JP | 2010-182726 A | 8/2010 | |
| JP | 2010-224303 A | 10/2010 | |
| JP | 2015-065189 A | 4/2015 | |
| JP | 2015065189 A * | 4/2015 | |
| JP | 2015-179761 A | 10/2015 | |
| WO | 2010/004882 A1 | 1/2010 | |
| WO | WO-2015005107 A1 * | 1/2015 | ........ H01S 3/06704 |
| WO | 2018/146924 A1 | 8/2018 | |

OTHER PUBLICATIONS

Notification of Reasons for Refusal issued in Japanese Patent Application No. 2019-138108, dated Sep. 29, 2020 (6 pages).
International Search Report issued in corresponding International Application No. PCT/JP2020/027994, dated Oct. 6, 2020 (8 pages).
Written Opinion issued in corresponding International Application No. PCT/JP2020/027994, dated Oct. 6, 2020 (4 pages).

* cited by examiner

PRELIMINARY STUDY EXAMPLE

FUNDAMENTAL WAVE OUTPUT CHARACTERISTICS
EMISSION MIRROR 67%

FIBER LASER APPARATUS

BACKGROUND

Technical Field

The present invention relates to a fiber laser apparatus that can be configured in small size and compact form.

Description of Related Art

Figure 7:
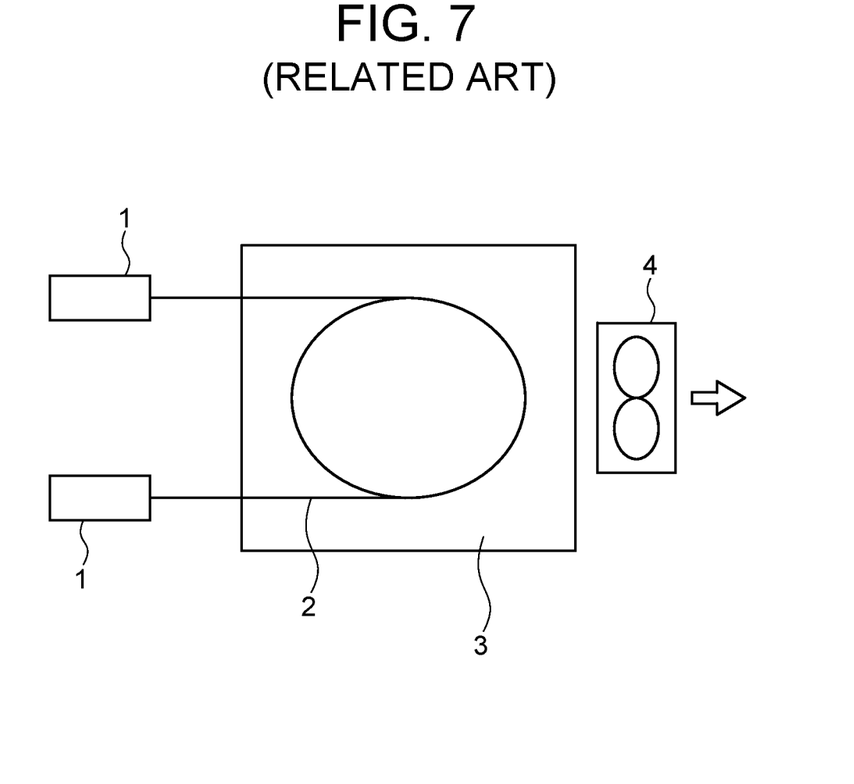
FIG. 7 is a drawing showing a principal part of a conventional fiber laser apparatus.

A conventional constitution example of a fiber laser apparatus using an optical fiber to which active element (rare earth elements, transition elements, or rare earth ions (Yb, Nd, Er, Pr, Dy, Ce, Tb, etc.)) is added, is shown in FIG. 7. This conventional example includes a fiber 2 in a circular form in which a gain fiber with a length of a degree exceeding 10 m is wound up and wound around, a ferrule 1 made from zirconia and provided on input and output ends of the fiber 2 in order to support the fiber 2 that tends to break easily because of being thin in thickness and weak in mechanical strength, a substrate and radiator 3 to support the fiber 2 and for discharging heat, and a cooling fan (or water-cooling device) 4. There may be a case where nickel or stainless steel is used for the ferrule 1 to weld and fix the tip of the fiber. In order to make the laser apparatus as compact as possible, the fiber 2 is wound around, and in order to improve cooling efficiency, the fiber is kept from overlapping with each other. A diameter of a circle in which the fiber is wound around is about 30 cm or less. The substrate and radiator 3 and the fiber 2 come in contact with each other in such state that heat resistance is suppressed as much as possible by using heat conductive paste. In the substrate and radiator 3, heat accumulated in the fiber 2 is discharged by using the cooling fan (or water-cooling device) 4 or a Peltier element. The doping concentration of rare earth in the fiber 2 is made low concentration and its strip length is made long, thereby to obtain two items of increase of the cooling surface and increase of the dispersion effect of heat accumulation in the direction of the fiber length, and it becomes possible to perform efficient cooling.

Patent Literature 1 discloses an optical fiber laser apparatus in which one long laser fiber wounded around by multiple times is embedded and fixed without clearance in transparent ultraviolet curable resin in form of a rectangular parallelepiped shape, and both ends of the laser fiber are exposed outside.

PATENT LITERATURE

Patent Literature 1: JP H10-135548A

In the conventional fiber laser apparatus shown in FIG. 7, since a gain fiber with length of about 10 m is used, it is necessary to wind around the fiber, and hence small and compact design smaller than the winding-around diameter is difficult, so that there has been a limit in making the apparatus in small compact structure. The optical fiber laser apparatus of Patent Literature 1 is also in the similar situation, also, in the structure where the long laser fiber wounded around by multiple times is embedded without clearance in the ultraviolet curable resin, the heat exhausting efficiency is lowered.

The small compact apparatus constitution is a subject originated from social request. In order to solve this subject, to shorten the length of the fiber (about 30 cm or less, or 20, 15 or 10 cm or less may be permissible) is required. For the purpose of shortening the length, it is necessary to use a gain fiber to which active element (rare earth elements, transition elements, or rare earth ions (Yb, Nd, Er, Pr, Dy, Ce, Tb, etc.)) is added with higher concentration than that of the conventional apparatus. However, when the fiber length is shortened, heat is accumulated in the fiber.

SUMMARY

One or more embodiments of the present invention provide a fiber laser apparatus that can prevent heat from being accumulated in the fiber arising due to the shortening of the fiber to downsize the apparatus.

A fiber laser apparatus of one or more embodiments of the present invention uses a fiber of short-length type to which an active element is added with high concentration, and includes a ferrule attached to an end of the fiber, and a housing to accommodate the fiber and to support the fiber with the ferrule, wherein each of the housing and the ferrule is composed of a metal material having a thermal expansion coefficient approximate to (i.e., equal to or have a predetermined difference from) a thermal expansion coefficient of a raw material of the fiber.

According to the fiber laser apparatus, since the housing and the ferrule are composed of a metal material with a thermal expansion coefficient approximate to that of a raw material of the fiber, it is possible to reduce heat accumulation in an end portion of the fiber during the apparatus is operated. Namely, since the housing and the ferrule are composed of a metal material having a high thermal conductivity, the thermal conductivity is increased than that of the conventional material, for example, ceramics, such as zirconia and the like. Accordingly, heat accumulation on the end portions of the fiber can be reduced. Also, since the metal material has a thermal expansion coefficient approximate to that of the raw material of the fiber, even if the fiber accumulates heat, it is possible to reduce the stress received from the housing and the ferrule due to a difference in the thermal expansion coefficients. In this way, since the heat accumulation in the fiber due to the shortening of the fiber can be prevented, it is possible to realize downsizing of the apparatus by shortening of the fiber.

A fiber laser apparatus of one or more embodiments of the present invention is a fiber laser apparatus to use a fiber of short-length type to which an active element is added with high concentration, includes a ferrule attached to an end of the fiber, and a housing to accommodate the fiber and to support the fiber with the ferrule, wherein the ferrule and the housing are composed of a material having a thermal conductivity of 90 W/mK or more and a thermal expansion coefficient of $10 \times 10^{-6}$ to $30 \times 10^{-6}$/K.

According to the fiber laser apparatus, since the ferrule and the housing are composed of a material having a thermal conductivity of 90 W/mK or more and a thermal expansion coefficient of $10 \times 10^{-6}$ to $30 \times 10^{-6}$/K, it is possible to reduce heat accumulation in an end portion of the fiber during the apparatus is operated. Namely, since the housing and the ferrule are composed of a metal material having a high thermal conductivity of 90 W/mK or more, the thermal conductivity is increased than that of the conventional material, for example, ceramics, such as zirconia and the like. Accordingly, heat accumulation on the end portions of the fiber can be reduced. Also, since the metal material has a thermal expansion coefficient of $10 \times 10^{-6}$ to $30 \times 10^{-6}$/K approximate to that of the raw material of the fiber, even if the fiber accumulates heat, it is possible to reduce the stress received from the housing and the ferrule due to a difference in the thermal expansion coefficients. In this way, since the heat accumulation in the fiber due to the shortening of the fiber can be prevented, it is possible to realize downsizing of the apparatus by shortening of the fiber.

In the above-mentioned fiber laser apparatus, the fiber may have a length of 300 mm or less, the raw material of the fiber may be a fluoride glass material, and the fiber may include a fiber core in which a doping concentration of Pr element is 1500 to 5000 ppm.

Also, the above-mentioned fiber laser apparatus may oscillate laser light with any one or two of wavelengths of 520 nm±10 nm, 610 nm±10 nm, and 638 nm±10 nm.

According to the fiber laser apparatus of one or more embodiments of the present invention, since the heat accumulation in the fiber due to shortening of the fiber can be prevented, it becomes possible to realize downsizing of the apparatus.

DETAILED DESCRIPTION OF EMBODIMENTS

Figure 1:
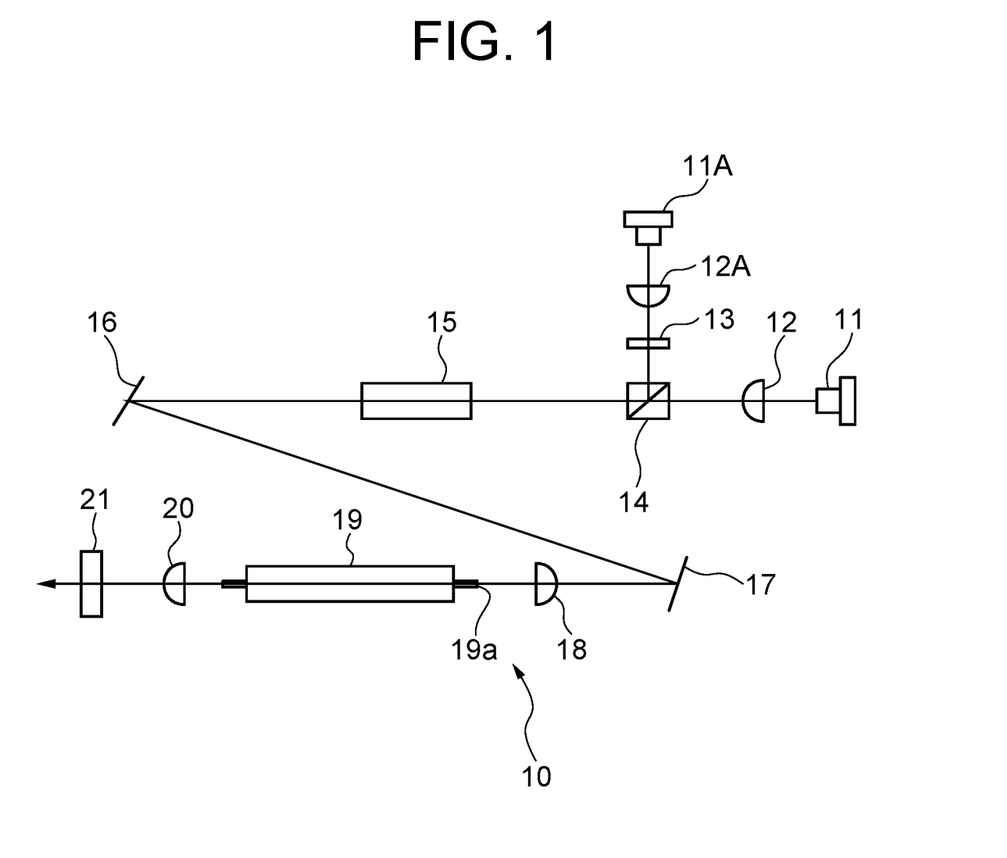
FIG. 1 is an optical path diagram showing schematically a fiber laser apparatus according to one or more embodiments.
Figure 2A:
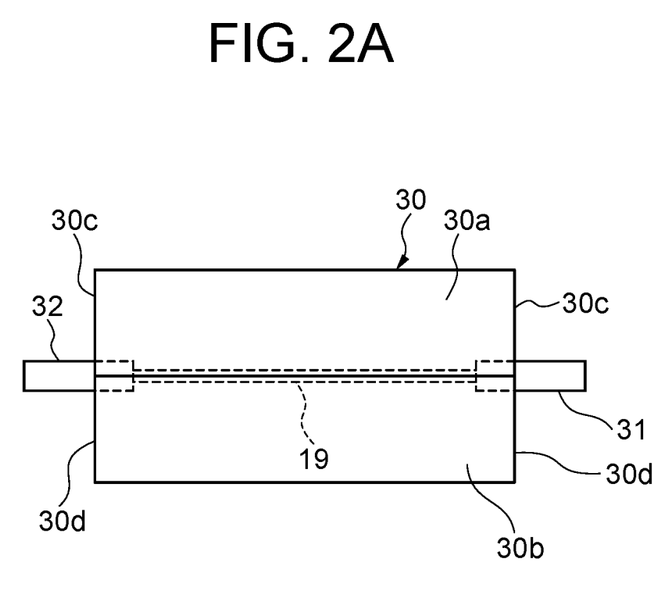
FIG. 2A is a front view showing schematically a housing to accommodate the fiber shown in FIG. 1.
Figure 2B:
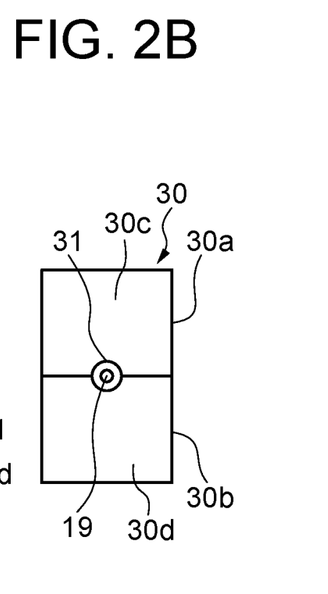
FIG. 2B is a side view showing schematically the housing.
Figure 3:
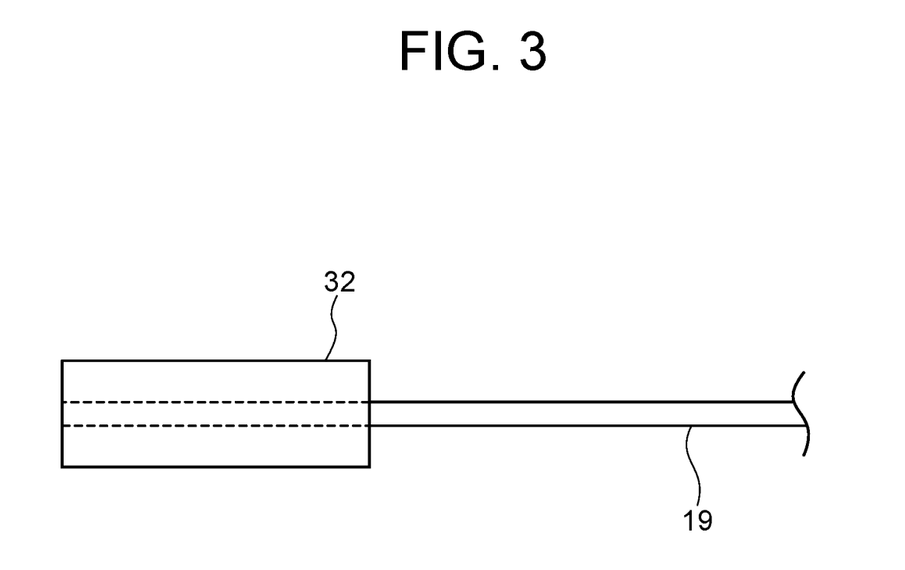
FIG. 3 is an illustration showing a ferrule attached to an end of the fiber shown in FIG. 2A.

Hereinafter, embodiments of the present invention will be described with reference to drawings. FIG. 1 is an optical path diagram showing schematically a fiber laser apparatus according to one or more embodiments. FIG. 2A is a front view showing schematically a housing in which a fiber in FIG. 1 is accommodated, and FIG. 2B is a side elevation showing schematically the housing. FIG. 3 is an illustration showing a ferrule attached to an end of the fiber in FIG. 2A.

As shown in FIG. 1, a fiber laser apparatus 10 according to one or more embodiments includes semiconductor lasers 11 and 11A, lenses 12 and 12A, a wavelength plate 13, a polarization beam splitter 14 in which a laser beam passed through the lens 12 from the semiconductor laser 11 and a laser beam passed through the lens 13A and the wavelength plate 13 from the semiconductor laser 11A and provided with a phase difference of 90 degrees, enter and are combined, an anamorphic prism pair 15 in which the laser beam from the polarization beam splitter 14 enters and emits, and total reflection mirrors 16 and 17 that totally reflects the laser beam from the anamorphic prism pair 15.

The fiber laser apparatus 10 further includes a lens 18 in which the laser beam from the total reflection mirror 17 enters, a short-length type fiber 19 in which the laser beam from the lens 18 enters, a lens 20 in which the laser beam from the fiber 19 enters, and an emission mirror 21 that emits the laser beam from the lens 20.

For example, when an oscillation wavelength of the semiconductor laser is set to 442 nm to excite the fluoride fiber, lights are emitted with strong spectrum of wavelengths of 520 nm (green), 610 nm (orange), and 638 nm (red)). Where, for example, 638 nm is selected with coatings on an incident end face 19a of the fiber 19 and the emission mirror 21, a red fundamental wave laser beam is output. Also, for example, where 610 nm and 638 nm are selected, orange and red fundamental wave laser beams are output.

In order to design the fiber laser apparatus 10 with a smaller compact structure, it is required to shorten the fiber length by making concentration of rare earth element in the gain fiber higher. For that purpose, a heat exhausting means is required for effectively preventing heat accumulation in the fiber 19 caused by the length shortening.

As shown in FIGS. 2A-2B, an apparatus constitution as such a heat exhausting means is configured so that ferrules 31 and 32 are bonded onto (or attached to) both ends of the fiber 19 length-shortened with addition of high-concentration active element (rare earth elements, transition elements etc., or rare earth ions (Yb, Nd, Er, Pr, Dy, Ce, Tb, etc.)) so as to absorb excitation light sufficiently, and then, the ferrules 31 and 32 and the fiber 19 are accommodated in the housing 30 in a state where the ferrules 31 and 32 are brought in contact with side plates 30c and 30d respectively on both sides of the housing 30 to suppress heat resistance as much as possible by using a heat conductive paste.

That is, as shown in FIGS. 2A-2B, the housing 30 has a structure divided into two parts, and when an upper part 30a and a lower part 30b are butted each other, the ferrules 31 and 32 are positioned at semicircular cut-out portions formed in the respective side plates 30c and 30d so as to be clamped and supported between the semicircular cut-out portions. As shown in FIGS. 2A-2B and FIG. 3, the fiber 19 is inserted into a through hole of each of the ferrules 31 and 32 with the application of adhesive bond.

The fiber 19 has a length of about 30 cm or less, and the length may be 20, 15, or 10 cm or less. Also, for example, the fiber 19 is made of fluoride glass material as raw material, and may include a fiber core in which a doping concentration of Pr element is 1500 to 5000 ppm.

By constituting the ferrules 31 and 32 from metal (for example, copper, aluminum, stainless steel, nickel, their alloys, etc.) that are high thermal conductive materials, it is possible to realize (1) efficient thermal conducting from the end portion of the fiber, (2) protecting of the fiber end portion which are apt to break easily because of being thin in diameter and weak in mechanical strength, (3) facilitating of polishing work for fiber end face, and (4) facilitating of formation of dielectric coating film onto fiber end face.

Also, the housing 30 is composed of metal materials (for example, copper, aluminum, stainless steel, nickel, their alloys, etc.) that are high thermal conductive materials, so that the housing 30 can efficiently conduct heat generated in the fiber 19 from the ferrules 31 and 32 brought in contact with the side plates 30c and 30d of the housing 30 to suppress thermal resistance as much as possible and can radiate such heat. For this reason, the housing 30 also functions as heat radiator. The heat radiated from the housing 30 is discharged by using a cooling fan, a water-cooling device, or a Peltier element provided in the housing 30, whereby heat accumulated in the fiber 19 can be discharged effectively.

Moreover, the housing 30 and the ferrules 31 and 32 are constituted from materials having a thermal expansion coefficient coincide with or approximate to that of the raw materials of the fiber 19, whereby it is possible to prevent breakage of fiber end surface and dielectric multilayer coating surface caused by a difference in thermal expansion coefficient and generated by heat accumulation at the time of high output operation in the apparatus.

As mentioned above, the respective materials constituting the housing 30 and the ferrules 31 and 32 have a thermal expansion coefficient approximate to that of raw material of the fiber 19 and a high thermal conductivity, whereby it is possible to prevent the heat accumulation in the fiber due to length-shortening of the fiber.

EXAMPLE

Next, one or more embodiments of the present invention are described concretely on the basis of the example and the preliminary study example. The present invention should not be limited to the example.

Preliminary Study Example

Figure 4:
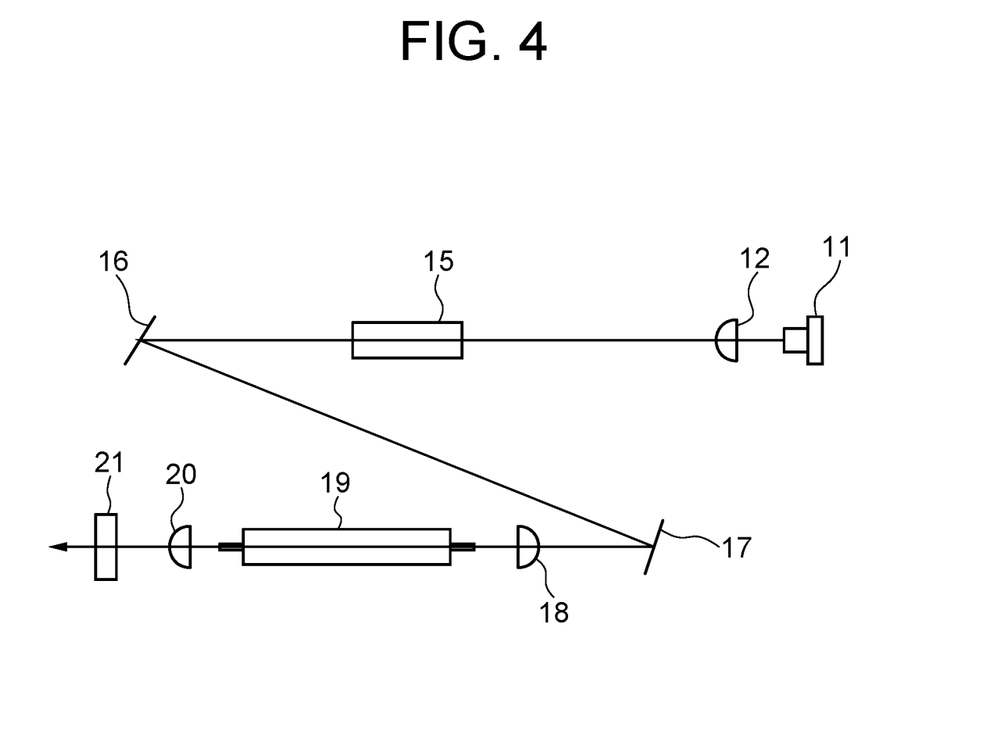
FIG. 4 is an optical path diagram showing schematically a fiber laser apparatus used in the present preliminary study example.

First, the preliminary study example having studied in advance is described. In this preliminary study example, a fiber laser apparatus shown in FIG. 4 was used. This apparatus has a constitution in which the semiconductor laser 11A, the lens 12A, and the wavelength plate 13 in FIG. 1 were omitted. The fiber 19 was accommodated by using the ferrules 31 and 32 in the housing 30 having structure similar to that in FIGS. 2A-2B and FIG. 3 and was fixed.

Figure 5:
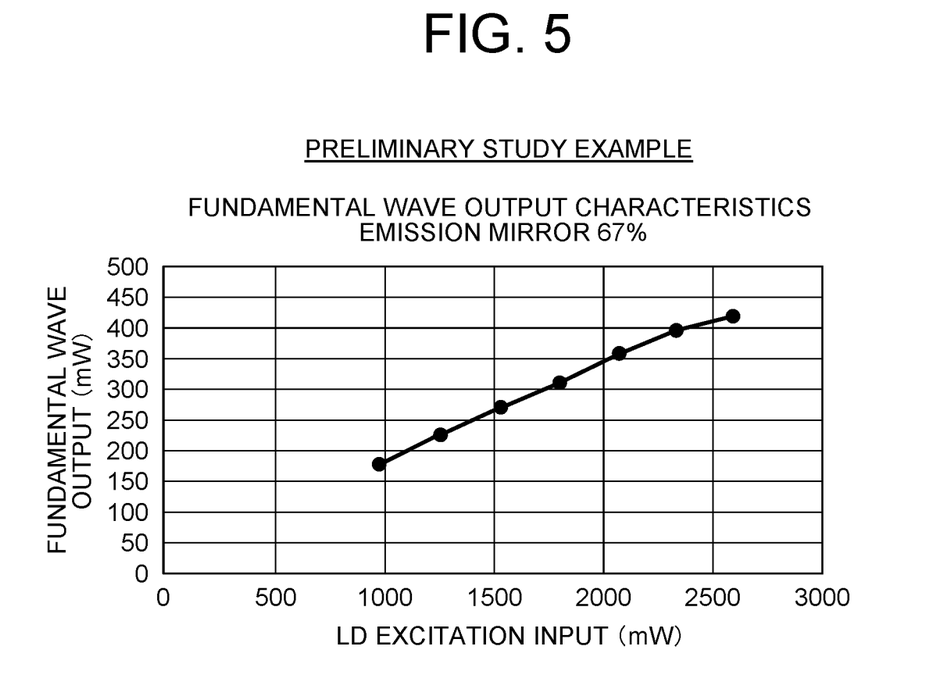
FIG. 5 is a graph showing the fundamental wave output characteristics of the fiber laser apparatus shown in FIG. 4 and obtained by the present preliminary study example.

The fiber 19 was a fluoride fiber with fiber diameter of 280 μm and fiber length of 17 cm. In the fiber core, Pr was doped with concentration of 3000 ppm. The ferrules 31 and 32 made from zirconia were mounted on both ends of the fiber 19. Each of the ferrules 31 and 32 had outside diameter of 2.5 mm, length of 12 mm, and inside diameter of 282 μm. After the fiber 19 was inserted into the ferrules, the fiber 19 was adhered with a resin adhesive agent. Also, the fiber 19 and the ferrules 31 and 32 are supported and fixed with the housing 30 made from aluminum for heat conducting and cooling. With this structure, dielectric multilayer coating of high reflection with wavelength of 638 nm is applied on an excitation side end face of the fiber 19 and dielectric multilayer coating of non-reflection with wavelength of 442 nm is applied on the emission mirror 21, and a laser resonator is constituted with 67% of the emission mirror. According to such constitution, as shown in FIG. 5, a fiber laser output of 0.425 W was attained, so that improvement of the output was confirmed. However, phenomenon that the output (wavelength of 638 nm) was saturated in the excitation semiconductor laser input of 2.5 W with wavelength of 442 nm, was observed.

It is a thermal saturation phenomenon caused by heat accumulation in the fiber end surface that it is considered as the cause. In the constitution of the conventional fiber laser apparatus shown in FIG. 7, since the active element doping concentration in the gain fiber is low, the heat accumulation does not occur. But, by shortening the fiber length for downsizing, remarkable heat accumulation becomes to appear on the excitation end surface of the fiber.

In the case where the laser operation is performed for a long time, temperature will rise in the ferrule itself. Therefore, a mechanism for dissipating the heat in the ferrule efficiently is needed. On the other hand, when the temperature at the tip of the fiber rises, the refractive index of the fiber will change. The light transmitting in the inside of the fiber is confined by a difference in refractive index between core material and cladding material. But, since the refractive index changes due to change of temperature vary the difference in refractive index, the mode in which the light propagates in the inside of the fiber varies. In the case where temperatures in the tip portion and the central portion of the fiber are different from each other, the propagation mode changes while the light is propagating in the inside of the fiber. Thus, a part of the light cannot propagate and is emitted out of the fiber. As a result, the temperature change in the propagating direction of the light in the fiber causes a decrease in transmission efficiency. Therefore, a mechanism for making the temperature uniform by dissipating the heat in the tip portion and diffusing the heat to the whole fiber, is needed. It is thought that a decrease in absorption coefficient relative to excitation light, a decrease in induced emission cross section, a shift in oscillation wavelength, an increase in loss by refractive index change, a deterioration in beam quality by heat birefringence, and the like, take place due to these causes, and a thermal saturation phenomenon appears.

Also, due to the excessive heat accumulation, the fiber receives stress caused by a difference in thermal expansion coefficient from the housing and the ferrules, thus the output is decreased, and the excessive heat accumulation may lead to destruction of the fiber end surface and the coating. Accordingly, the excessive heat accumulation should be prevented.

EXAMPLE

In order to reduce the thermal saturation phenomena that has become clear in the above-described preliminary study example, the following improvement has been made in the present example.

(1) As the ferrule for supporting the fiber end surface, a metallic ferrule with higher thermal conductivity was used in place of ceramics.

(2) In order to prevent breakage of a fiber end surface and a dielectric multilayer coating surface resulting from a difference in thermal expansion coefficient caused by the heat accumulation upon high output operation, materials having thermal expansion coefficients coincident with or approximate to each other were selected as each material of the fluoride fiber, the ferrule, and the housing.

Concretely, in FIG. 1 to FIG. 3, the fiber 19 being a laser medium is a fluoride fiber and has a fiber diameter of 280 μm and a fiber length of 17 cm. Pr of 3000 ppm is added to the fiber core. Onto both ends of the fiber, the ferrules 31 and 32 made from nickel are mounted. The ferrule has an outside diameter of 2.5 mm and a length of 12 mm. The ferrule has an inside diameter of 282 μm. After the fiber was inserted into the ferrule, the fiber was adhered with a resin adhesive agent. The fiber 19 and the ferrules 31 and 32 are supported and fixed by the housing 30 made from copper. With this structure, dielectric multilayer coating of high reflection with a wavelength of 638 nm is applied onto an excitation side end face 19a of the fiber 19, and dielectric multilayer coating of a reflection factor of 67% with a wavelength of 638 nm is applied onto the emission mirror 21, thus a laser resonator is constituted.

Figure 6:
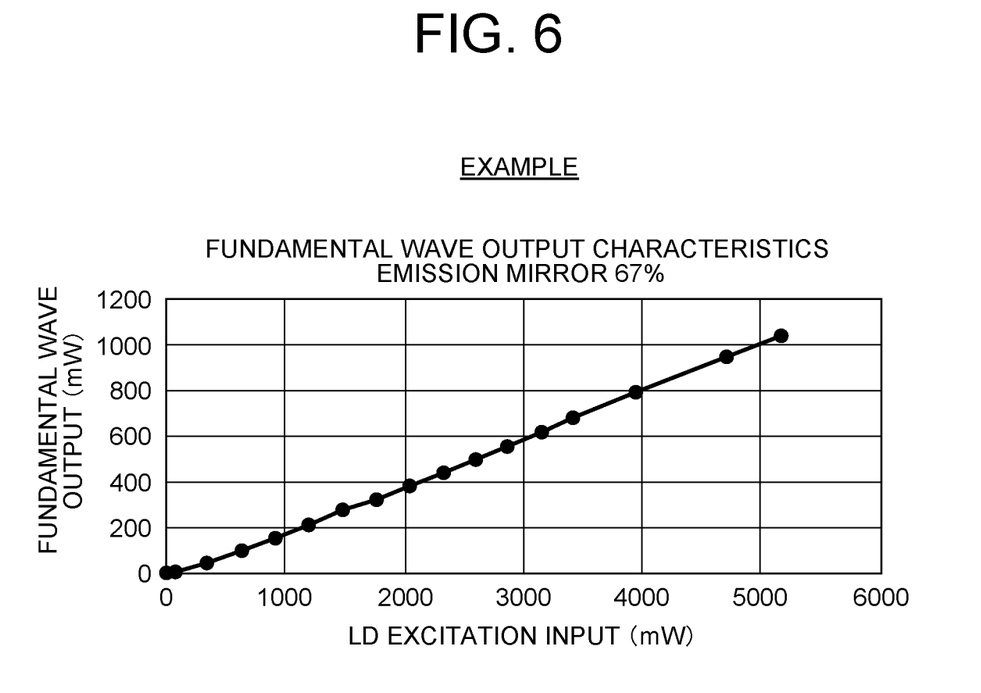
FIG. 6 is a graph showing the fundamental wave output characteristics of the fiber laser apparatus shown in FIG. 1 and obtained by the present example.

The thermal conductivities of fluoride fiber, nickel, and copper are 0.898 W/mK, 91 W/mK, and 403 W/mK, respectively. Moreover, the thermal expansion coefficients of fluoride fiber, nickel, and copper are $18.6 \times 10^{-6}$/K, $13.4 \times 10^{-6}$/K, and $16.5 \times 10^{-6}$/K, respectively. For example, if the thermal expansion coefficient (A) of the material of the ferrule and the housing is within the range of $10 \times 10^{-6}$ to $30 \times 10^{-6}$/K as described above, and if the thermal expansion coefficient (B) of the raw material of the fiber is $18.6 \times 10^{-6}$/K, the difference (A−B) is within $-8.6 \times 10^{-6}$ to $11.4 \times 10^{-6}$/K. Nickel and copper have a high thermal conductivity while having a thermal expansion coefficient approximate to that of the fluoride fiber. As a result, as shown in FIG. 6, the fiber laser output (a wavelength of 638 nm) of 1.0 W with an efficiency of about 20% was obtained relative to the excitation semiconductor laser input of 5.0 W with a wavelength of 442 nm, and the output was not saturated.

In the structure in which zirconia material was used for the ferrule and aluminum material was used for the housing as described in the preliminary study example, the laser output was saturated with the fiber laser output of 0.425 W relative to the excitation semiconductor laser input of 2.5 W, and an output more than that was not obtained. This is caused by decrease in absorption coefficient relative to the wavelength of the excitation semiconductor laser, decrease in induced emission cross section of the fiber material, and increase in propagation loss, because heat is accumulated in the fiber to increase the temperature due to the low thermal conductivity of the ferrule made from zirconia. On the other hand, the ferrule and the housing each having high thermal conductivity and thermal expansion coefficient approximate to that of the fiber material are replaced in the present example, whereby the increase of the laser output and the improvement of the efficiency were attained.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

For example, the constitution of the fiber laser apparatus shown in FIG. 1 is an example, and hence other constitution may be permissible.

Also, another materials can be used as the materials that constitute the ferrule and the housing, if the thermal expansion coefficient is approximate to the thermal expansion coefficient of the fiber and it has a high thermal conductivity of, for example, 90 W/mK or more.

INDUSTRIAL APPLICABILITY

According to the fiber laser apparatus of the present invention, since it is possible to prevent the heat accumulation in the fiber due to shortening length of the fiber, downsized apparatus can be realized and provided in response to the strong social request.

REFERENCE SIGNS LIST

10 fiber laser apparatus
11, 11A semiconductor laser
19 fiber
30 housing
30a upper portion
30b lower portion
30c, 30d side plate
31, 32 ferrule

What is claimed is:
1. A fiber laser apparatus comprising:
a short-length type fiber that is a laser medium to which an active element is added, and that has a length of 300 mm or less:
two ferrules attached to both ends of the fiber; and
a housing that:
  comprises an upper part and a lower part that respectively have semicircular cut-out portions butted against each other to form a hole, and
  accommodates the fiber and supports the fiber in the hole with the two ferrules,
  wherein an outer circumference of each of the two ferrules contacts an inner circumference of the hole such that the housing discharges heat generated in the fiber from side plates of the housing,
  wherein a part of each of the two ferrules protrudes outside from each of the side plates,
  wherein the fiber has a coating film formed on at least one of the both ends of the fiber, the both ends being respectively located at ends of the two ferrules,
  wherein each of the housing and the two ferrules is composed of a material having a first thermal expansion coefficient that is equal to or have a predetermined difference from a second thermal expansion coefficient of a raw material of the fiber, and
  wherein the predetermined difference between the first and second thermal expansion coefficients is within $-8.6\times10^{-6}$ to $11.4\times10^{-6}$/K.

2. The fiber laser apparatus according to claim 1, wherein the material of the housing and the two ferrules has a thermal conductivity of 90 W/mK or more.

3. The fiber laser apparatus according to claim 1, wherein the raw material of the fiber is a fluoride glass material.

4. The fiber laser apparatus according to claim 3, wherein the fiber includes a fiber core in which a doping concentration of Pr element is 1500 to 5000 ppm.

5. The fiber laser apparatus according to claim 1, wherein the fiber laser apparatus oscillates laser light with one or two of wavelengths of 520 nm±10 nm, 610 nm±10 nm, and 638 nm±10 nm.

6. The fiber laser apparatus according to claim 1, wherein the housing has a rectangular shape, and wherein the two ferrules are supported by the side plates of the housing using heat conductive paste.

7. The fiber laser apparatus according to claim 1, wherein the housing accommodates only solely the whole fiber in a straight condition and at least a part of each of the two ferrules supporting the fiber.

8. A fiber laser apparatus comprising:
a short-length type fiber that is a laser medium to which an active element is added, and that has a length of 300 mm or less:
two ferrules attached to both ends of the fiber; and
a housing that:
  comprises an upper part and a lower part that respectively have semicircular cut-out portions butted against each other to form a hole, and
  accommodates the fiber and supports the fiber in the hole with the two ferrules,
  wherein an outer circumference of each of the two ferrules contacts an inner circumference of the hole such that the housing discharges heat generated in the fiber from side plates of the housing,
  wherein a part of each of the two ferrules protrudes outside from each of the side plates,
  wherein the fiber has a coating film formed on at least one of the both ends of the fiber, the both ends being respectively located at ends of the two ferrules,
  wherein each of the two ferrules and the housing is composed of a material having a first thermal expansion coefficient within a range of $10\times10^{-6}$ to $30\times10^{-6}$/K, and wherein a second thermal expansion coefficient of a raw material of the fiber is within the range and equal to or have a predetermined difference from the first thermal expansion coefficient.

9. The fiber laser apparatus according to claim 8, wherein the material of the housing and the two ferrules has a thermal conductivity of 90 W/mK or more.

10. The fiber laser apparatus according to claim 8, wherein the raw material of the fiber is a fluoride glass material.

11. The fiber laser apparatus according to claim 8, wherein the fiber laser apparatus oscillates laser light with one or two of wavelengths of 520 nm±10 nm, 610 nm±10 nm, and 638 nm±10 nm.

12. The fiber laser apparatus according to claim 8, wherein the housing has a rectangular shape, and wherein the two ferrules are supported by the side plates of the housing using heat conductive paste.

13. The fiber laser apparatus according to claim 8, wherein the housing accommodates only solely the whole fiber in a straight condition and at least a part of each of the two ferrules supporting the fiber.

* * * * *